United States Patent [19]

Polata

[11] 3,767,981

[45] Oct. 23, 1973

[54] HIGH VOLTAGE PLANAR DIODE STRUCTURE AND METHOD

[75] Inventor: Bohumil Polata, Los Altos, Calif.

[73] Assignee: Signetics Corporation, Sunnyvale, Calif.

[22] Filed: June 4, 1971

[21] Appl. No.: 149,945

[52] U.S. Cl. .......................... 317/235 R, 317/235 AH

[51] Int. Cl. .......................... H01l 9/00

[58] Field of Search .......................... 317/235 AH, 235 T

[56] References Cited

UNITED STATES PATENTS

| | | | |
|---|---|---|---|
| 3,388,000 | 6/1968 | Waters et al. | 317/235 |
| 3,405,329 | 10/1968 | Love et al. | 317/235 |
| 3,491,273 | 1/1970 | Stiegler | 317/235 |
| 3,496,426 | 2/1970 | Kaiser | 317/235 |
| 3,604,990 | 9/1971 | Sigsbee | 317/235 |

FOREIGN PATENTS OR APPLICATIONS

| | | | |
|---|---|---|---|
| 2,000,657 | 9/1969 | France | 317/235 |

*Primary Examiner*—Jerry D. Craig
*Attorney*—Flehr, Hohbach, Test, Albritton & Herbert

[57] ABSTRACT

High voltage planar diode structure having a semiconductor body with a planar surface. The body has a region of a first conductivity type extending to the surface and a second region in the body of opposite conductivity type and also extending to the surface and being defined by a dish-shaped P-N junction within said first region and extending to the surface. A layer of insulating material is provided on the surface and has an opening therein exposing the surface in an area overlying the second region. The insulating layer is graduated in thickness so that it becomes progressively thicker in a direction away from the opening in the insulating layer. Metallic means is disposed on the insulating layer and makes contact to said second region through the opening in the insulating layer and forms a field plate which generally overlies the depletion layer which is formed during operation of the diode.

1 Claim, 16 Drawing Figures

INVENTOR.
Bohumil Polata
BY Flehr, Hohbach, Test, Albritton & Herbert
Attorneys

INVENTOR.
Bohumil Polata
BY Flehr, Hohbach, Test, Albritton & Herbert
Attorneys

HIGH VOLTAGE PLANAR DIODE STRUCTURE AND METHOD

BACKGROUND OF THE INVENTION

1. Field of Invention

This invention relates to a high voltage planar diode structure using a field plate and an insulating layer having graduated thickness underlying the field plate and an overlapping shield structure for providing protection from high energy charged particles.

2. Description of prior art

In semiconductor structures, field plates have been utilized for increasing the voltage capabilities of such devices. However, basic problems have been encountered in connection with such devices. It has been found that for a field plate to be effective, the insulating layer normally of silicon dioxide underlying the field plate should be relatively thin. If a thick oxide layer is utilized, interface charges may override the effect of the voltage that is present on the field plate. To provide a semiconductor structure which has a high breakdown voltage, it is necessary to provide an oxide layer which is relatively thick, which requirement is inconsistent with the requirement for making a field plate effective. In addition, it has been found that such semiconductor structures are exposed to an environment with charged or ionizing particles, the junction breakdown of the device deteriorates significantly. There is, therefore, a need for a new and improved semiconductor structure and in particular a diode structure which can be utilized with high voltages and which is still effective in an environment having charged or ionizing particles.

SUMMARY OF THE INVENTION AND OBJECTS

The high voltage planar diode structure consists of a semiconductor body which has a planar surface. The body has a first region of one conductivity type extending to the surface and a second region of opposite conductivity type within said first region and extending to said surface and being defined by a dish-shaped P-N junction extending to the surface. A layer of insulating material is formed on the surface. The layer of insulating material has an opening therein exposing said surface in an area overlying the second region. The layer of insulating material is graduated in thickness so that it increases in thickness in a direction away from the opening in the insulating layer. Metallic means is disposed on said layer of insulating material and extends into said opening and makes contact with the area of said surface overlying said second region. The metallizing means overlies a substantial portion of the first region and generally covers the depletion region which is formed during operation of the diode structure. In addition, overlapping shielding means can be carried on said surface and generally surrounds said field plate.

In the method, the oxide layer can be graduated in thickness by forming successive layers of insulating material which have progressively larger openings therein so that the portions of the oxide layer defining the openings are graduated in thickness. The shielding structure can be formed on successive layers of the insulating material.

In general, it is an object of the present invention to provide a high voltage planar diode structure which is effective at high voltages.

Another object of the invention is to provide a diode structure of the above character which is effective in an environment having charged or ionizing particles.

Another object of the invention is to provide a diode structure of the above character in which the high voltage junction breakdown characteristics are retained.

Another object of the invention is to provide a structure of the above character in which overlapping shielding layers are provided.

Another object of the invention is to provide a structure of the above character in which the overlapping shielding layers are separated by layers of insulating material.

Another object of the invention is to provide a method for fabricating a high voltage planar diode structure in which successive layers of insulating material are formed which have progressively larger openings.

Another object of the invention is to provide a method of the above character in which the shielding layers are formed between the successive layers.

Additional objects and features of the invention will appear from the following description in which the preferred embodiments are set forth in detail in conjunction with the accompanying drawings.

DESCRIPTION OF THE PREFERRED EMBODIMENTS

Figures 1, 2, 3, 4, 5, 6:
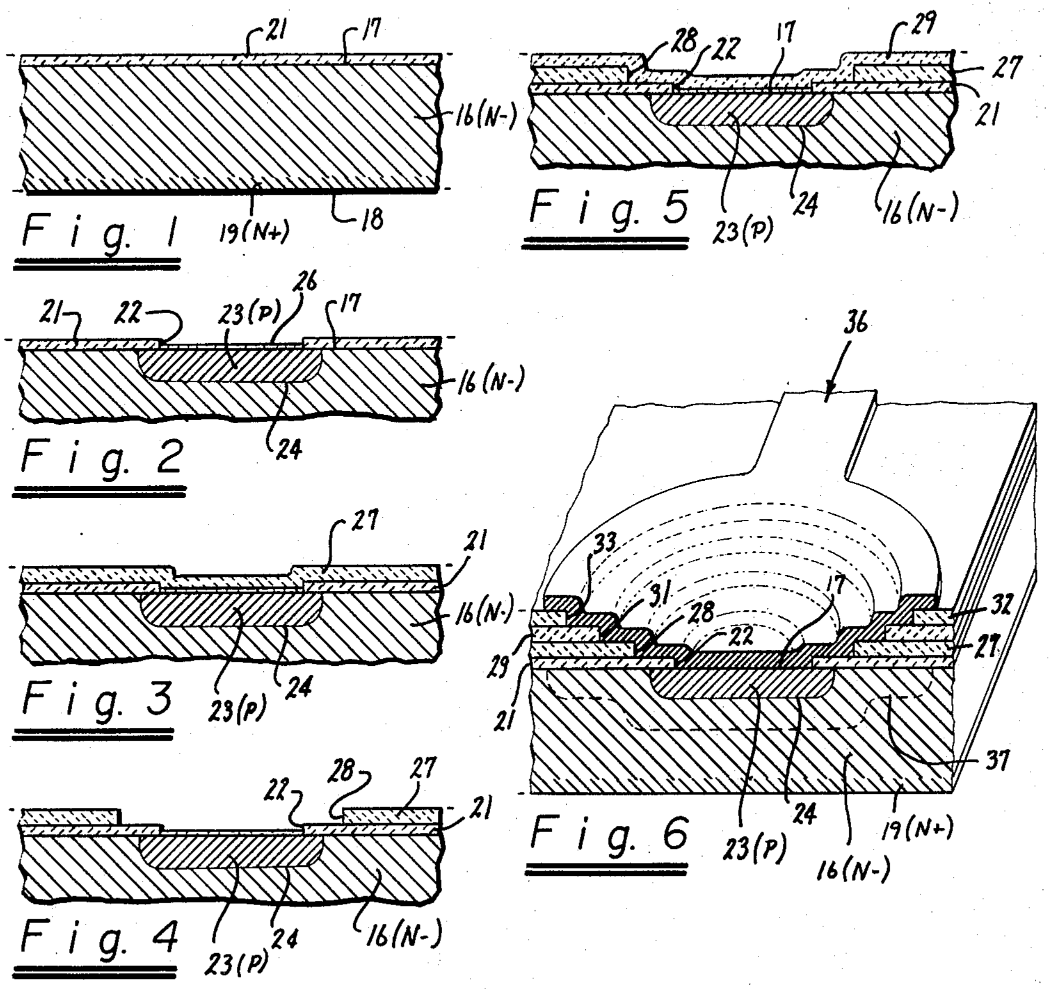
FIGS. 1–6 are cross-sectional views with FIG. 6 also being a partial isometric view showing the steps for fabricating a high voltage planar diode structure incorporating the present invention.

The high voltage planar diode structure is fabricated by taking a semiconductor body or substrate 16 which can be in the form of a wafer formed of a suitable material such as silicon. The body or wafer 16 can be formed with a suitable impurity therein such as an N-type impurity. Alternatively, an N-type impurity can be diffused into the semiconductor body 16. The body 16 is provided with front and back surfaces 17 and 18 which are generally planar and parallel as shown. An additional N-type impurity is diffused into the back surface 18 to provide an N+ layer 19 which is used as hereinafter described for making a good contact to the back side of the body 16. It is preferable that the N-type impurity which is utilized be of a relatively slow diffusing type as, for example, arsenic or antiomony. A masking layer 21 formed of a suitable material such as silicon dioxide is formed on the surface 17. Thus, for example, a thermally grown silicon dioxide layer 21 can be provided in a manner well known to those skilled in the art. This layer 21 is grown to a suitable thickness ranging from 0.3 micron to 1 micron.

By the use of a first mask and suitable photolithographic techniques, openings 22 are formed in the layer 21 to expose areas of the surface 17. Thereafter, a P-type impurity is diffused through the openings 22 to form a second region 23 of the N-type region of the body 16 and extends to the surface 17 and is defined by a P-N junction 24 which is dish-shaped in cross-section and which extends to the surface 17 beneath the masking layer 21. During the formation of the regions 23, thin oxide layers 26 will be formed in the openings 22 which can be used as a reference layer. The layer 26 can be utilized as a reference layer which can be left in place until the desired number of insulating layers have been provided on the surface 17. This makes it possible to protect the surface 17 overlying the region 23 and the border for the opening formed by the insulating layer. Alternatively, if desired, the layer 26 can be stripped away and another layer, either thermally grown or deposited, can be formed in the opening 22. The layer can be formed to a desired thickness to give a desired color as, for example, blue-green so that it will be readily apparent to the fabricator of the devices when the etching operation has been carried far enough while still protecting the surface 17 overlying the region 23. By way of example, the reference layer 26 can have a thickness of 2,500 Angstroms which gives a light blue appearance by reflection.

After the diffusion of the P-type impurity which is an impurity of a conductivity opposite of the impurity within the body 16, an insulating layer 27 is formed of a suitable material such as deposited silicon dioxide is formed on the layer 21 and extends into the openings 22 as shown in FIG. 3. The layer 27 is grown to a suitable thickness ranging from approximately .5 to 1.5 microns.

By utilization of a second mask and conventional photolithographic techniques, openings 28 which have a size which is slightly larger than the size of the openings 22 are formed in the layer 27 and extend through the layer 27 to expose the inner portions of the layer 21 and to expose the reference layer 26.

An additional insulating layer 29 is then deposited upon the exposed portions of the layers 27 and 21 and in the opening 22 on the layer 26. This insulating material can again be formed of a deposited silicon dioxide. A third mask is then utilized with conventional photolithographic techniques to form openings 31 in the oxide layer 29 which have a size which is larger than the openings 28 and to also remove the deposited oxide which has been formed in the openings 28 and 22 down to the reference layer 26.

Additional layers of oxide with progressively larger openings can be formed in a similar manner with each of the layers having a thickness ranging from approximately 0.5 to 1.5 microns until the cumulative thickness of the oxide layers is sufficiently great to accommodate the voltage under which the device is to operate. Thus, by way of example, there has been provided another insulating layer 32 in which a fourth mask has been utilized to form openings 33 which are larger than the openings 31. The desired number of layers can be established mathematically as hereinafter described.

After the desired number of layers of insulating material have been provided with the desired openings therein, the reference layer 26 is removed by a suitable etch. Thereafter, metal of a suitable type such as aluminum is evaporated onto the surface of the top layer as, for example, the layer 32 as shown in FIG. 6 so that it is deposited in the opening 22 on the area of the surface 17 overlying the region 23 and also deposited on the steps formed by the successive layers of insulating material. A mask is then utilized in conjunction with conventional photolithographic techniques to remove the undesired metal so that there remains a contact structure 36 which makes contact to the region 23 and which also serves as a field plate. The geometry of the metal contact structure 36 and the device can be circular as shown or, alternatively, can be rectangular or any other desired geometry.

The use of a field plate is described in copending application Ser. No. 791,695, filed Jan. 16, 1969, now abandoned. As exaplined therein, the geometry of the field plate is such that it generally overlies at least a substantial portion of the first region beyond the P-N junction 24 so that it will cover the depletion region which is formed within the body 16 and which is indicated by the broken line 37 in FIG. 6. In viewing FIG. 6, it can be seen that the insulating layer which underlies the field plate 36 is graduated in thickness so that it becomes progressively thicker in a vertical direction with respect to the surface 17 and in a direction away from the opening 22 toward the outer extremity of the field plate. As shown in FIG. 6, this progressive increase in thickness occurs in steps. It is preferable that these steps be relatively small so that shadowing will not occur during evaporation of the metal which forms the contact and field plate structure 36. Thus, as pointed out above, it is preferable that the layers of insulating material other than the first layer have a thickness ranging from 0.5 to 1.5 microns, whereas for the first layer to achieve optimum effectiveness from the field plate it should be substantially thinner as, for example, from 0.3 to 1.0 micron. It will be noted that the outer margin of the field plate structure 36 is such that it overlies the greatest combined thickness of the combined insulating layers provided on the surface 17.

Junction breakdown occurs in a planar structure because of the inability of a depletion layer to spread sufficiently at the silicon dioxide junction interface. For a field plate to be effective in spreading the depletion layer from the metallurgical junction and the silicon dioxide interface, the silicon dioxide thickness should be small (preferably less than 0.5 micron). Experimental evidence has shown that in order to obtain a high junction breakdown as, for example, 250 volts, an oxide thickness of a minimum of approximately 1.5 microns is required. Even that may not be sufficient in applications in which the silicon dioxide surface may be exposed to mobile charged particles. For the field plate to be effective to neutralize any interface charges, the silicon dioxide layer should be thin. On the other hand, for high voltage operation, a thick oxide layer under the field plate is necessary. This is due at least in part to the fact that mobile charged particles over a thick oxide layer at the field plate will have negligible influence on the structure.

The construction which is shown in FIG. 6 overcomes these disadvantages and brings the mutually exclusive requirements of thin oxide layer in one case and a thick oxide layer in the other case into compatibility with the field plate by utilizing an insulating layer in the form of silicon dioxide underlying the field plate which is graduated in thickness from the opening overlying the field plate and makes contact with a doped region of the semiconductor structure. The thin oxide layer allows the field plate to be effective even at low voltages on the field plate. As the bias voltage increases, the depletion layer spreads reaching the final configuration shown in FIG. 6.

The relationships of voltage, electric field, electric charge and distance for any physical stationary system such as the semiconductor structure hereinbefore described where large aggregates of elementary particles are considered (i.e., quantum mechanics need not be taken into account) are governed by the laws of electrostatics. These relationships will be used in making an analysis of the depletion layer of a high voltage diode in a reverse bias condition incorporating the present invention. The diode structure approximates an "infinite plane" so that a one-dimensional Poisson's equation can be used:

$$\nabla^2 V = -(d_E/d_x) = -(\rho(x)/\epsilon\,\epsilon_o) \quad (1)$$

where:

$\epsilon$ = relative permitivity, 11.7 for silicon; 3.9 for $SiO_2$ $\epsilon_o$ = dielectric constant of free space, $8.85 \times 10^{-14}$ farad/cm.

$\rho$ = charge density per unit volume $V$ = voltage $\nabla$ = operator del (see Advanced Engineering & Mathematics by C. R. Wiley, Jr., published by Wiley)

For a case of a one-sided step junction with uniform impurity distribution and neglecting the built-in junction potential, this Poisson's equation can be expanded to:

$$\nabla^2 V = -(d_E/d_x) = -\rho(x)/\epsilon\epsilon_o) = (-q\,N_d)/\epsilon\,\epsilon_o) \quad (2)$$

where:

$N_d$ = donor concentration in atoms/cm$^3$ $q$ = electric charge, $1.6 \times 10^{-19}$ coulomb/donor atom Neglecting the practical limitations, the maximum breakdown voltage that a P-N junction can support is physically limited by the critical electric field ($E_{critical}$). If the bias voltage is increased to the point where the electric field approaches $E_{critical}$ value, ionization of carriers takes place and current flow increases without appreciable increase in the bias voltage. The magnitude of critical electric field for silicon as a function of concentration has been determined and is tabulated in Table I for some concentrations in units of volts per micron. Since $E_{critical}$ is established by physics as being a function of concentration and making use of Poisson's equation, the maximum obtainable theoretical breakdown voltage that a one-sided step junction can support can be calculated. However, before this can be accomplished, the maximum depletion layer should be determined. This is done by making use of the fact that the slope of the magnitude of E in the depletion layer is uniquely defined by the substrate impurity concentration that is given by the equation (3).

$$d_E/d_x = q\,N_d/\epsilon\epsilon_o = 1.546\times10^{-7}\,N_a\ (\text{volts/cm}^2) = 2.546\times10^{-15}N_d(\text{Volts}/\mu^2) \quad (3)$$

This simplification in the formula is made possible by selection for this example a substrate with uniform impurity distribution. While this may not be absolutely true, it is sufficiently true in an actual structure so that an analysis may be made without undue use of mathematical manipulations. With such an assumption, the necessary calculations can be accomplished by the use of algebra, whereas if it is assumed that the impurity concentration on follows a Gaussian distribution law, difficult integrations would be required. The relationship of impurities, electric field and voltage is set forth in detail in A. S. Grove's "Physics and Technology of Semiconductor Devices," published by Wiley in 1967, Chapter 6, pages 152–163.

The value of $E_{critical}$ obtained from known references and the calculated value of the magnitude of the electric field change $d\,|\,E\,|\,/d_x$ (in $V/\mu^2$), the maximum depletion layer $d_j$ (in microns) and the maximum voltage of $V_{max}$ that a one-sided junction can support are summarized in Table I below for a number of concentration values.

TABLE I

| Impurity conc (atoms/cm$^3$) | $E_{crit}$ (V/$\mu$) | $d_E/d_x$ (V/$\mu^2$) | $d_j$ max Microns | $V_{max}$ Volts |
|---|---|---|---|---|
| $1 \times 10^{14}$ | 25 | 0.155 | 161 | 2021 |
| $3.5 \times 10^{14}$ | 29 | 0.541 | 53.6 | 777 |
| $1 \times 10^{15}$ | 32 | 1.55 | 20.7 | 331 |
| $3.5 \times 10$- | 37 | 5.41 | 6.84 | 126 |
| $1.0 \times 10^{16}$ | 43 | $1.55\times10$ | 2.78 | 59.8 |
| $3.5\times10^{16}$ | 51 | $5.41\times10$ | 0.95 | 24.3 |
| $1.0\times10^{17}$ | 61 | $1.55\times10^2$ | 0.39 | 12.0 |
| $3.5\times10^{17}$ | 90 | $5.41\times10^2$ | 0.16 | 7.47 |
| $1.0\times 10^{18}$ | 136 | $1.55\times10^3$ | 0.088 | 5.98 |

It should be noted that the calculations in Table I were made from a case where $E = E_{critical}$. However, a similar set of calculations can be made for any set of relationships of E, $x_j$, $N_d$ and V where $x_j$ is the depletion layer width.

While the relationships for "infinite plane" diode described above are useful to gain some insight into the problems involved, they do not fully describe the actual situation where devices and diodes must have finite dimensions. Before taking into account such considerations, it is appropriate to first consider an ideal situation of voltage, electric field, electric charge and distance relationship of a structure that contains a silicon dioxide electric as shown in FIG. 6 on page 434 of S. M. Sze "Physics of Semiconductor Devices," published by Wiley in 1969, and the description thereof in Chapter IX, pages 425–470.

Now assuming that only depletion under the metal at the silicon dioxide-silicon interface takes place (that is, inversion is prevented by a transfer electric field described in detail hereinafter), the total voltage across the structure is given by $$V_T = V_{ox} + V_{depl} \quad (4)$$

where:

$V_T$ = total voltage drop $V_{ox}$ = voltage drop across oxide $V_{depl}$ = voltage drop across depletion layer Before considering detailed calculations, it is useful to appreciate the phenomena involved. The electric field in the depleted region of semiconductor results from immobile charged atoms of the impurity as the mobile electrons are swept out. Therefore, the electric field increases toward the $SiO_2$-Si interface in relation to the electric flux. The electric flux is constant through the interface and assuming no charges are located within the $SiO_2$, continues constant through the oxide resulting in constant $E_{ox}$ throughout.

The electric field in silicon dioxide and silicon at the interface can be calculated from the fact that total effective flux density D is constant across the interface. In general, the effective flux density and electric field are related by:

$$D = \epsilon\ \epsilon_o\ E \quad (5)$$

Therefore, at the silicon dioxide-silicon interface, the following relationship holds:

$$\epsilon_{Si} \cdot \epsilon_o\ E_{Si} = \epsilon_{SiO_2}\ \ \epsilon_o\ E_{SiO_2} \quad (6)$$

out of which the electric field in silicon dioxide is $$E_{SiO_2} = (\epsilon_{Si}/\epsilon_{SiO_2})\ E_{Si} = 3\ E_{Si} \quad (7)$$

Now:

letting $a = d_E/d_x = q\ N_d/\epsilon\ \epsilon_o$ and using previously derived relationships, equation (4) can be restated as:

$$V_T = V_{ox} + V_{depl} = 3Ta\ x_j = ½\ a\ x_j^2 \quad (8)$$

or $$x_j^2 = (6T)x_j - (2V_t/a) = 0 \quad (9)$$

and $$x_j(1,2) = -3T \pm \sqrt{(3T)^2 = 2V_T/a} \quad (10)$$

The depletion layer $x_j$ and $d_E/d_x$ determine the magnitude of E at the interface in silicon as well as in the silicon dioxide. A certain portion of the voltage is supported by the depletion layer in silicon and a portion of the voltage is supported by the silicon dioxide layer. The sum of the voltage is supported by the silicon and the silicon dioxide must be equal to the total voltage $V_T$. It should be pointed out that $E_{out}$ for silicon dioxide is in the range of $10^3$ volts/$\mu$ as compared to less than $10^2$ volts/$\mu$ for silicon and consequently a condition where oxide breakdown occurs will not be reached in a properly designed structure.

With the foregoing derivations, the depth of the depletion layer and the voltage distribution for a high voltage diode structure can be calculated using a field plate and a graduated or stepped oxide or insulating layer underlying the field plate. By way of example, the diode structure can be made by a shallow P-type diffusion into an N-type substrate with $N_d = 4\times10^{14}$ impurities/atom/cm$^3$. The oxide thickness can vary from zero to 10 microns and the calculation is done for the reverse bias of 400 volts, 200 volts and 40 volts as set forth in Tables II, III and IV, respectively. The $d_E/d_x$ for the substrate or semiconductor body is 0.6172 V/$\mu^2$.

TABLE II

Case of 400 V reverse bias

| Oxide Thickness $\mu$ | Depl L Width $\mu$ | E in Silicon V/$\mu$ | E in $SiO_2$ V/$\mu$ | Voltage Drop Across Si Depl Layer | Voltage Drop Across $SiO_2$ Layer |
|---|---|---|---|---|---|
| 0 | 36.00 | 22.22 | 0 | 400 | 0 |
| 0.5 | 34.50 | 21.31 | 63.93 | 368.80 | 31.20 |
| 1.0 | 33.12 | 20.45 | 61.33 | 338.64 | 61.36 |
| 1.5 | 31.78 | 19.61 | 58.85 | 311.73 | 88.27 |
| 2.0 | 30.49 | 18.82 | 56.47 | 287.06 | 112.94 |
| 3.0 | 28.11 | 17.35 | 52.05 | 243.85 | 156.15 |
| 4.0 | 25.95 | 16.02 | 48.05 | 207.81 | 192.19 |
| 5.0 | 24.00 | 14.81 | 44.44 | 177.78 | 222.22 |
| 6.0 | 22.25 | 13.73 | 41.21 | 152.80 | 247.20 |
| 7.0 | 20.68 | 12.76 | 38.29 | 131.97 | 268.03 |
| 8.0 | 19.26 | 11.89 | 35.68 | 114.58 | 285.42 |
| 9.0 | 18.00 | 11.11 | 33.33 | 100.01 | 299.99 |
| 10.0 | 16.86 | 10.41 | 31.22 | 87.76 | 312.24 |

TABLE III

Case of 200 V reverse bias

| Oxide Thickness $\mu$ | Depl L Width $\mu$ | E in Silicon V/$\mu$ | E in $SiO_2$ V/$\mu$ | Voltage Drop Across Si Depl Layer | Voltage Drop Across $SiO_2$ Layer |
|---|---|---|---|---|---|
| 0 | 25.46 | 15.71 | | 200 | |
| 0.5 | 24.00 | 14.83 | 44.43 | 177.8 | 22.2 |
| 1.0 | 22.63 | 13.96 | 41.90 | 157.9 | 42.1 |
| 1.5 | 21.35 | 13.18 | 39.54 | 140.7 | 59.3 |
| 2.0 | 20.15 | 12.44 | 37.32 | 125.4 | 74.6 |
| 3.0 | 18.00 | 11.11 | 33.33 | 100.0 | 100.0 |
| 4.0 | 16.14 | 9.99 | 29.97 | 80.8 | 119.2 |
| 5.0 | 14.54 | 8.98 | 26.93 | 65.3 | 134.7 |
| 6.0 | 13.17 | 8.13 | 24.39 | 53.5 | 146.5 |
| 7.0 | 12.00 | 7.41 | 22.22 | 44.5 | 155.5 |
| 8.0 | 10.99 | 6.78 | 20.34 | 37.3 | 162.7 |
| 9.0 | 10.10 | 6.24 | 18.72 | 31.5 | 168.5 |
| 10.0 | 9.33 | 5.77 | 17.30 | 26.9 | 173.1 |

TABLE IV

Case of 40 V reverse bias

| | | | | | |
|---|---|---|---|---|---|
| 0 | 11.38 | 7.02 | | 40 | |
| 0.5 | 9.98 | 6.16 | 18.49 | 30.76 | 9.24 |
| 1.0 | 8.77 | 5.42 | 16.25 | 23.75 | 16.25 |
| 1.5 | 7.74 | 4.78 | 14.34 | 18.50 | 21.50 |
| 2.0 | 6.87 | 4.24 | 12.72 | 14.56 | 25.44 |
| 3.0 | 5.51 | 3.40 | 10.21 | 9.38 | 30.62 |
| 4.0 | 4.54 | 2.80 | 8.41 | 6.36 | 33.64 |
| 5.0 | 3.83 | 2.37 | 7.09 | 4.53 | 35.47 |
| 6.0 | 3.29 | 2.04 | 6.11 | 3.36 | 36.64 |
| 7.0 | 2.89 | 1.78 | 5.35 | 2.57 | 37.43 |
| 8.0 | 2.56 | 1.58 | 4.75 | 2.03 | 37.97 |
| 9.0 | 2.30 | 1.41 | 4.26 | 1.64 | 38.36 |
| 10.0 | 2.09 | 1.29 | 3.87 | 1.34 | 38.66 |

It should be kept in mind that the calculations set forth above were made assuming that the thickness of the oxide layers would range from 0.5 micron to 10 microns. It should be appreciated that the number of steps or layers forming the combined oxide thickness are dependent upon the precise requirements of the device.

From the above calculations, it can be seen that the depletion layer decreases in depth with increased oxide thickness under the field plate. As set forth above, this decrease in width of depletion layer results from Poisson's relationship of voltage and electric field and an increased voltage supported by the thicker oxide layer. That is, the voltage supported by the oxide layer increases with the oxide thickness and this, in turn, results in voltage drop along the silicon-silicon dioxide interface. This voltage drop along the silicon-silicon dioxide interface provides additional accelerating potential for any electron-hole pairs that may be generated and also to sweep out any mobile charge that may occur at the interface during fabrication.

The calculations in the above Tables II, III and IV were made to obtain an insight into the potential distribution for a range of bias voltages and oxide thicknesses. The oxide thicknesses were arbitrarily divided into ten separate portions. Up to approximately 100 volts of back bias, a field plate is unnecessary but is necessary at higher voltages as, for example, 200 volts and 400 volts, to prevent breakdown. By examining the charts, the number of layers of oxide covering the surface can be selected to provide a condition in which no more than 40 to 60 volts are supported by the depletion layer in the semiconductor body at the outer periphery at the field plate.

As established by Poisson's equation as set forth above, the electric field between the semiconductor silicon and the insulator, silicon dioxide, is determined by the ratio of the dielectric constants of the two materials which for silicon is approximately 3.9 and for silicon dioxide is approximately 11.7, to provide a ratio of almost 3:1. Because the dielectric strength of the silicon dioxide is much greater than that of silicon, it is advantageous to have most of the voltage supported by the silicon dioxide layer.

At the point at which the P-N junction 24 extends to the surface below the silicon dioxide insulating layer, the silicon dioxide is relatively thin which means that the field plate will be effective even at low voltages. As the thickness of the insulating layer increases, a greater proportion of the total voltage will be borne by the silicon dioxide. For example, in Table III, for 200 volts, where the oxide is 10 microns in thickness, the oxide will support 195 volts and the depletion layer in the silicon need only support 5 volts.

Any number of layers can be utilized under the field plate to obtain the desired results. The stepped effect created by the progressive layers having larger openings therein approximate a tapered or sloping side wall which inclines downwardly toward the surface 17.

The field plate causes the depletion layer near the surface 17 to be spread about over a much wider area so that the electric field is reduced. In other words, a sufficiently large negative voltage at the field plate pushes electrons away from the surface 17 and, therefore, the depletion layer is moved downwardly into the greater bulk of the semiconductor body 16 and is also spread out over a large area when viewed in cross-section in a plane which is parallel to the plane of the surface 12. In this way, the electric field is greatly reduced and breakdown, if it occurs, takes place inside the semiconductor body rather than at the surface 17.

Figure 7:
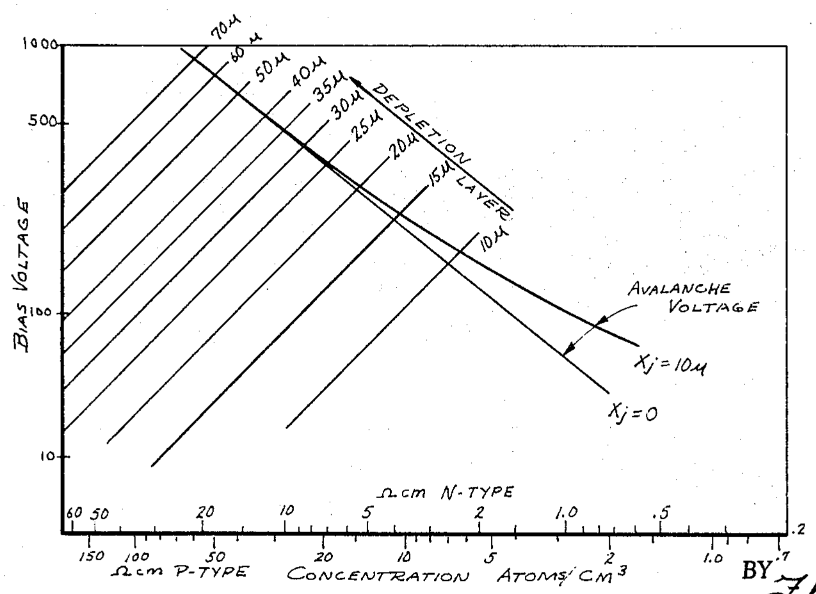
FIG. 7 is a graph showing bias voltage, concentration and depletion layer with reference to breakdown voltage for devices of the type shown in FIG. 6.
Figure 8:
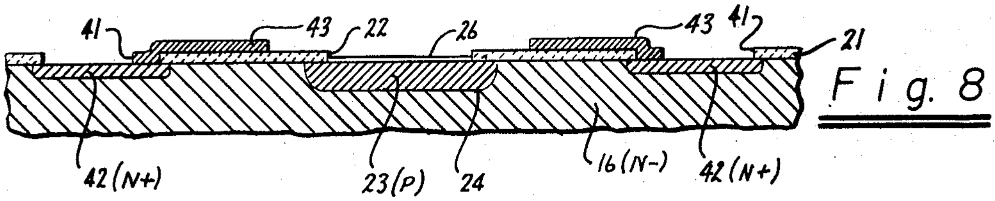
FIGS. 8–11 are cross-sectional views showing the steps for fabricating a high voltage planar diode structure incorporating another embodiment of the invention.

The graph in FIG. 7 shows the relationship between bias voltage, impurity concentration and the depletion layer including the maximum theoretical breakdown or avalanche voltage. This graph was calculated using Poisson's equation and data available in publications. The graph in FIG. 7 is utilized in designing high voltage diodes in accordance with the present invention. The desired voltage is selected on the Y axis. The corresponding substrate impurity concentration and the depletion layer thickness can be picked off of the graph.

Another embodiment of the invention is shown in FIGS. 8–11 in which an overlapping shielding structure is provided which surrounds the contact and field plate structure 36 to form a low impedance path for high energy charged particles that may penetrate the silicon dioxide layer or which may be located at the surface of the silicon dioxide layer. To provide such a shielding structure, openings 41 are formed in the oxide layer 21 by the use of a mask and suitable photolithographic techniques. An N-type impurity is then diffused through the opening 41 to form a region 42 extending into the body 16. A layer of metal is then evaporated onto the surface of the silicon dioxide layer 21 and into the openings 41. Thereafter, the undesired metal is removed so that there remains a metal shielding layer 43. If circular geometry is utilized as is shown in FIG. 6, the region 42 would be annular and would surround the P-type region 23 and similarly the shielding layer 43 would be annular.

Figure 9:
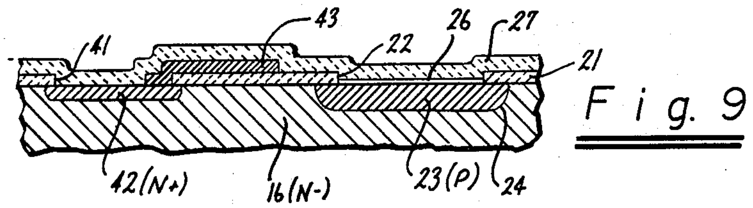
Figure 10:
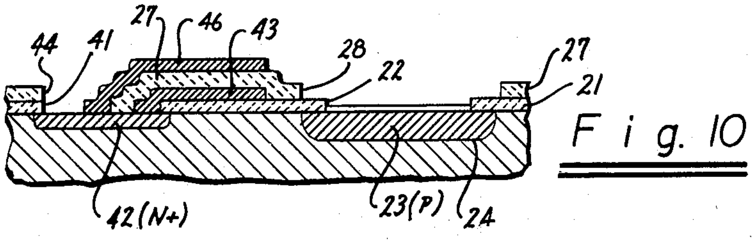
Figure 11:
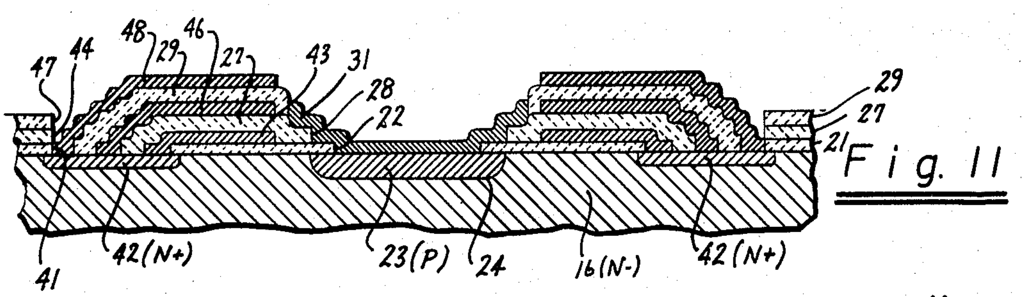
Figure 12:
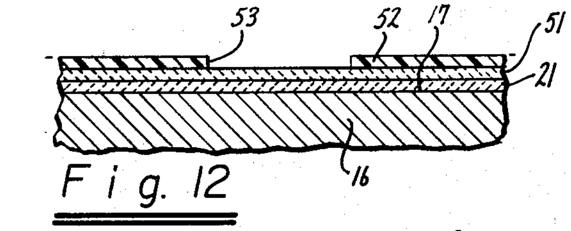
FIGS. 12–16 are additional cross-sectional views showing the steps for fabricating another embodiment of the high voltage planar diode structure incorporating the present invention.
Figure 15:
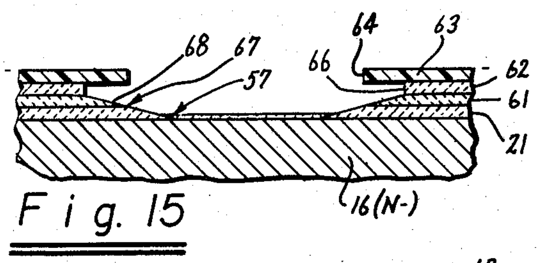

After the shielding layer is completed, a low temperature glass or silicon dioxide is deposited over the shielding layer 43 and over the regions 42 and 23 as shown particularly in FIG. 9 to form an insulating layer 27. Thereafter, as shown in FIG. 10, the openings 28 are formed in the manner hereinbefore described. At the same time, openings 44 are formed in the layer 27 by the use of a suitable mask and photolithographic techniques so that the openings 44 are in registration with the holes 41. Thereafter, metal is deposited in the manner hereinbefore described and the undesired portions are removed to provide a second metal shielding layer 46 which overlies the shielding layer 43 although it is spaced above and has its outer margin spaced from the outer margin of the lower layer 43. The inner margins of the layers 43 and 46 are in general vertical alignment and encircle or surround the active device which is formed in the semiconductor body.

An insulating layer 29 is then formed on the layer 46 and openings 31 are formed in the layer 29. Additional openings 47 which are in registration with the openings 41 and 44 are provided in the layer 29 and another metal shielding layer 48 is provided which is spaced from the layer 46 in the same manner that the layer 46 is spaced from the layer 43. In the same manner, additional overlapping shielding layers can be provided with one shielding layer being provided between each two layers of insulating material. Thus, if 10 insulating layers are provided, at least nine shielding layers can be provided.

It should be appreciated that the shielding structure can be formed of other materials than metal because the shielding structure need not be a particularly good conductor. Only a very small current flow will occur in the shielding structure. For example, doped polycrystalline silicon can be utilized for making such an overlapping or interlocking shielding structure. Also, it should be appreciated that although a plurality of shielding plates have been provided, as few as one shielding plate can be used although it is preferable to use more than one.

The overlapping shielding layers form a shielding structure which provides a low impedance path into the body 16 through the N+ contact region for high energy charged particles that may penetrate the silicon dioxide layer or may be located at the surface of the silicon dioxide layer. Any mobile species such as ions which are created in the silicon dioxide will be bled off by the shielding layers into the N+ region 42. For this reason, the effectiveness of the high voltage diode structure will not deteriorate when exposed to an environment which contains mobile charged species or an environment where the structure is exposed to intentional or accidental bombardment of high energy electrons and other charged particles.

Figure 13:
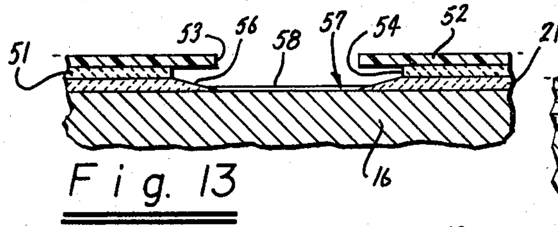
Figure 16:
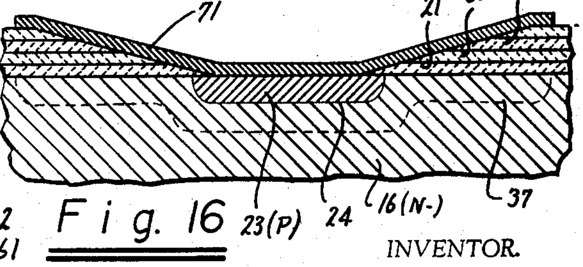
Figure 14:
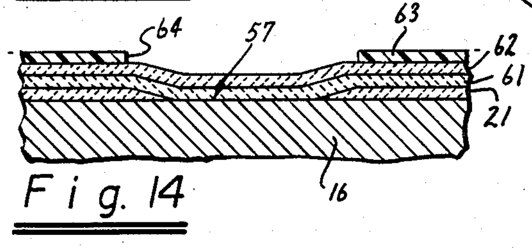

Another method for fabricating the semiconductor structure is shown in FIGS. 12–16 which eliminates the use of the steps. In this embodiment of the invention, a technique and method which is described fully in copending application Ser. No. 135,892, filed Apr. 21, 1971, now U.S. Pat. No. 3,687,189 is utilized. As explained briefly herein, the semiconductor body 16 has a surface 17 on which there is formed a thermally grown silicon oxide layer 21 and that thereafter there is deposited on the silicon oxide layer 21 a layer 51 of a suitable material such as vapor deposited silicon dioxide. The principal requirement is that the layer 51 which is deposited have a much higher etch rate than the layer 21. A layer 52 of a suitable photoresist is then deposited on the surface of the layer 51. By utilization of a mask, the photoresist layer 52 is exposed and the undesired portions are removed so there are provided openings 53 which expose the layer 52. A suitable etch such as a HF/ammonium fluoride mixture is then utilized so that there is provided an opening 54 in the silicon dioxide layer 21 which underlies the photoresist layer 52. At the same time that the layer 52 is being attacked, the layer 21 which has a slower etch rate is also being attacked by the etchant. However, since it is etched at a lower rate and also because the surface of the layer 21 is progressively exposed by the upper layer 52 being etched away, the side wall or surface 56 of the layer 21 defining the opening 57 is inclined or sloped as shown in FIG. 13. If desired, a reference layer 58 can be provided in the same manner as the reference layer 26.

After the opening 57 has been formed, the photoresist 52 can be stripped and then two additional layers 61 and 62 can be formed on the layer 21 and into the opening 56. In this case, a different material than thermally grown silicon dioxide should be utilized for the layer 61. For example, vapor deposited silicon dioxide can be utilized for the first layer, and thereafter the second layer 62 is formed of a material which has a higher etch rate such as a doped vapor deposited silicon dioxide in which the amount of doping affects the etch rate. As pointed out previously, it is only necessary that the layers 61 and 62 have different etch rates.

Another layer 63 of photoresist is then deposited on the layer 62. Openings 64 are formed in the photoresist and thereafter an etchant is utilized which will attack both the layers 61 and 62 so that there are formed openings 66 in the layer 62 and openings 67 in the layer 61. Again, the opening 67 will be defined by an inclined side wall 68 which preferably will have a similar or the same slope as the slope of the side wall 56. The photoresist layer 63 can then be removed.

This same process can be carried out until the insulating layer which is to be utilized has a sufficient thickness. It can be appreciated that since inclined side walls are provided, the insulating layers can be substantially thicker than those utilized in the previous embodiments because there will be substantially no shadowing by the inclined side walls during evaporation of the metal for the metal contact. Thus, after the insulating layer has been formed to a suitable thickness, a layer of metal is deposited on the surface of the insulating layer and into the opening 57 and the undesired metal is removed so that there remains the metal contact structure 71 which is similar to the metal contact structure 36 as shown in FIG. 6. This metal contact structure makes contact to the diffused region 23 and also forms a field plate of the type hereinbefore described. It also should be appreciated that, if desired, an overlapping shielding structure of the type hereinbefore can be utilized.

It is apparent from the foregoing that there has been provided a high voltage planar diode structure utilizing a field plate and which may or may not use an overlapping shield structure for the protection from high energy charged particles.

I claim:

1. In a semiconductor structure, a semiconductor body having a planar surface, said body having a first region of one conductivity type extending to said surface, said body having a second region within said first region and of opposite conductivity type and extending to said surface and being defined by a generally dish-shaped P-N junction extending to said surface, a layer of insulating material disposed on said surface, said layer of insulating material having an opening therein exposing said surface in an area overlying said second region, a metallic structure serving as a field plate disposed on said layer of insulating material and making contact with said second region through said opening, said layer of insulating material underlying said metallic structure and surrounding said opening being graduated in thickness so that it becomes progressively thicker in a direction away from said opening at any angle from said opening, said metallic structure extending outwardly beyond where the P-N junction extends to the surface, and metallic shielding means generally surrounding said metallic structure and in contact with said first region, said shielding means being in the form of a plurality of layers of conducting material overlapping each other and being insulated from each other.

* * * * *